United States Patent [19]

Tomimuro et al.

[11] Patent Number: 5,182,631
[45] Date of Patent: Jan. 26, 1993

[54] FILM CARRIER FOR RF IC

[75] Inventors: Hisashi Tomimuro, Kanagawa; Fuminori Ishitsuka, Saitama; Nobuo Sato; Takaaki Osaki, both of Tokyo, all of Japan

[73] Assignee: Nippon Telegraph and Telephone Corporation, Tokyo, Japan

[21] Appl. No.: 879,502

[22] Filed: Apr. 29, 1992

Related U.S. Application Data

[63] Continuation of Ser. No. 670,452, Mar. 8, 1991, abandoned, which is a continuation of Ser. No. 337,568, Apr. 13, 1989, abandoned.

[30] Foreign Application Priority Data

Apr. 15, 1988 [JP] Japan .................. 63-91593

[51] Int. Cl.⁵ .................................. H01L 23/48
[52] U.S. Cl. .................... 257/664; 257/688; 257/670
[58] Field of Search ............ 357/65, 68, 74, 80, 357/70; 333/33, 247

[56] References Cited

U.S. PATENT DOCUMENTS

| | | | |
|---|---|---|---|
| 3,936,864 | 2/1976 | Benjamin | 357/81 |
| 4,376,287 | 3/1983 | Sechi | 357/81 |
| 4,472,690 | 9/1984 | Hallford | 333/263 |
| 4,523,159 | 6/1985 | Dobrovolny | 333/247 |
| 4,612,566 | 9/1986 | Kowata et al. | 333/247 |
| 4,626,805 | 12/1986 | Jones | 333/33 |
| 4,631,820 | 12/1986 | Harada | 357/69 |
| 4,709,254 | 11/1987 | Haghiri-Tehrani | 357/68 |
| 4,734,667 | 3/1988 | Alberty et al. | 333/250 |
| 4,788,584 | 11/1988 | Hirano et al. | 357/74 |
| 4,837,184 | 6/1989 | Liu et al. | 357/74 |
| 4,890,155 | 12/1989 | Miyagawa et al. | 357/74 |
| 4,890,195 | 12/1989 | Heckaman et al. | 357/81 |
| 4,899,207 | 2/1990 | Hallowell et al. | 357/68 |
| 4,907,061 | 3/1990 | Kohara | 357/74 |
| 4,949,158 | 8/1990 | Ueda | 357/69 |

FOREIGN PATENT DOCUMENTS

| | | | |
|---|---|---|---|
| 0059601 | 4/1983 | Japan | 333/247 |
| 62-5652 | 1/1987 | Japan | 357/74 |
| 63-296347 | 12/1988 | Japan | |
| 8910005 | 10/1989 | PCT Int'l Appl. | |

Primary Examiner—Joseph A. Popek
Assistant Examiner—Viet Q. Nguyen
Attorney, Agent, or Firm—Blakely, Sokoloff, Taylor & Zafman

[57] ABSTRACT

A waveguide film carrier includes an insulating flexible substrate, RF, bias supply and ground electrodes formed on the insulating flexible substrate, and conductive leads connected to the electrodes. An opening portion corresponding to a bare-chip semiconductor element to be mounted is formed in a portion of the insulating flexible substrate. The leads are formed to project in the opening portion at positions corresponding to electrode pads of the bare-chip semiconductor element to be mounted. The leads are formed on an outer peripheral portion of the insulating substrate to project at positions corresponding to the internal connection terminals of the package. The waveguide film carrier further includes at least one waveguide. The waveguide is constituted by the RF electrodes for contributing to RF signal propagation, the ground electrodes and the insulating flexible substrate.

2 Claims, 13 Drawing Sheets

FILM CARRIER FOR RF IC

This is a continuation of application Ser. No. 07/670,452 filed Mar. 8, 1991 now abandoned, which is a continuation of application Ser. No. 337,568 filed Apr. 13, 1989, now abandoned.

BACKGROUND OF THE INVENTION

The present invention relates to a waveguide film carrier used for evaluating and mounting an RF microwave device.

In general, an RF microwave device is housed in a package. The package has internal connection terminals for a device therein. Each connection terminal extends outside the package to serve as a package input/output terminal. The film carrier of the present invention is applied between the device housed in the package and the internal connection terminals of the package.

Figure 1:
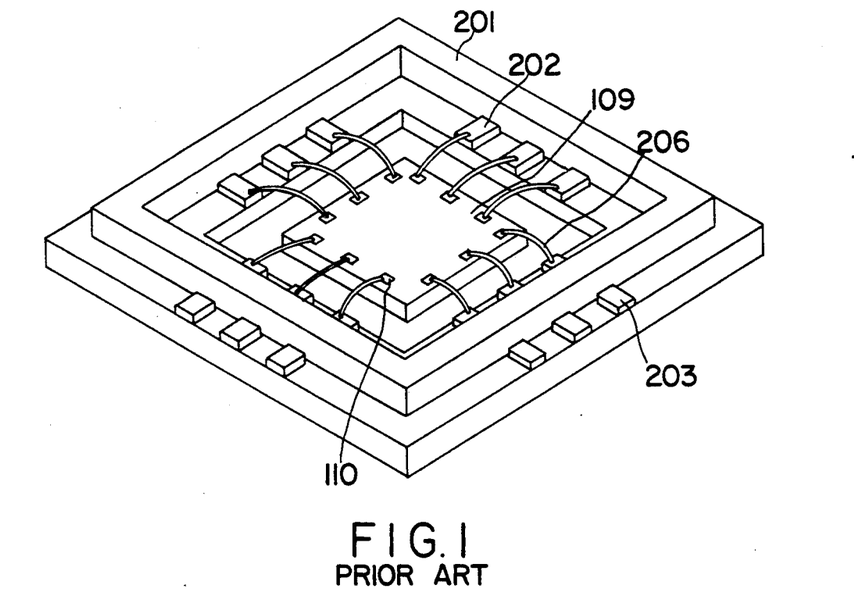
FIG. 1 is a perspective view for explaining a conventional wire bonding method.

A wire-bonding method shown in FIG. 1 is conventionally used to connect a bare-chip semiconductor as a device housed in a package to connection terminals of the package. Referring to FIG. 1, reference numeral 201 denotes a package consisting of, e.g., ceramic; 202, internal connection terminals formed in the package; 109, a bare-chip semiconductor; 110, electrode pads of the bare-chip semiconductor; and 206, wires consisting of, e.g., gold. Input/output to/from the bare-chip semiconductor is performed from each input/output terminal of the package via a corresponding wire 206. Each wire 206 is connected to a corresponding internal connection terminal by thermocompression bonding.

Figure 2:
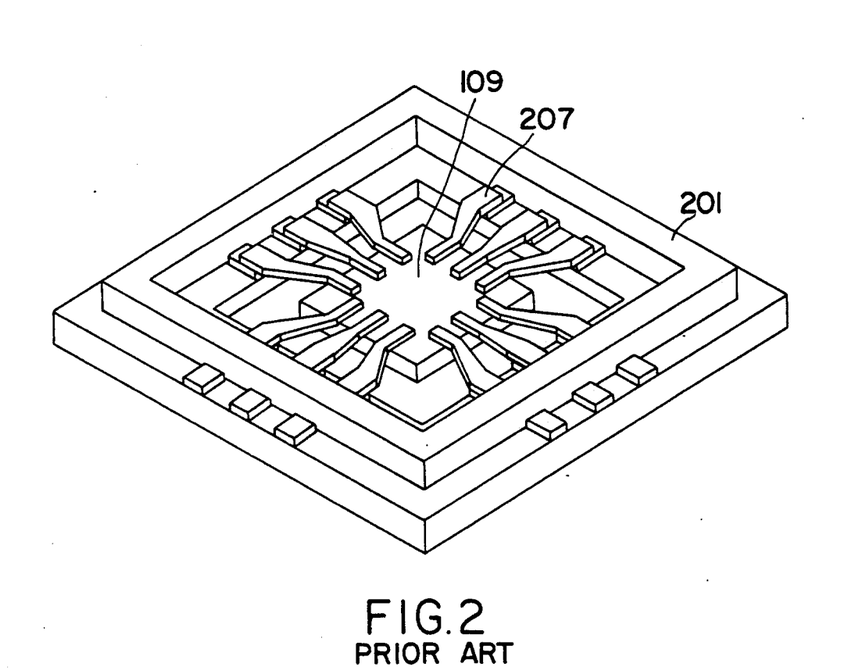
FIG. 2 is a perspective view for explaining a conventional method using a film-like conductor.
Figure 3A:
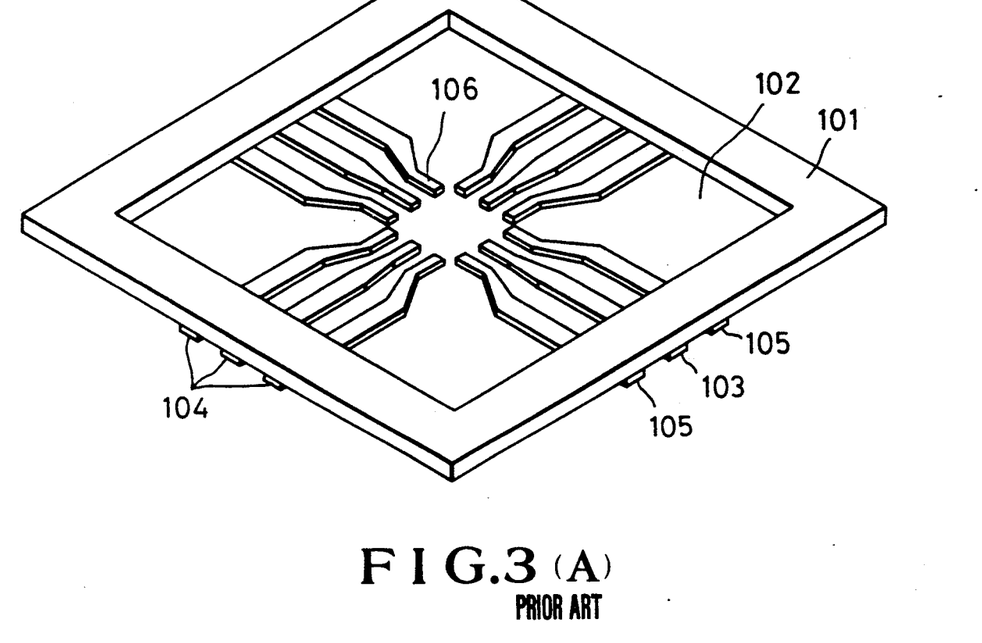
FIGS. 3A to 3E are views showing a conventional film carrier.
Figure 3B:
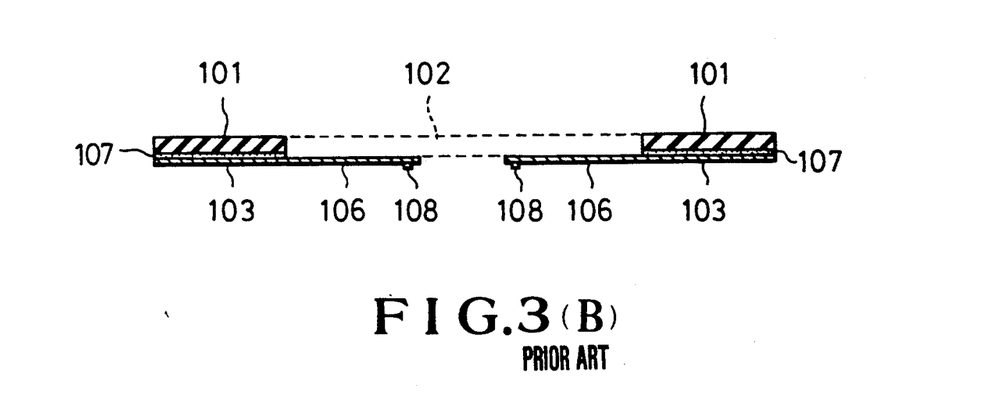
Figure 3C:
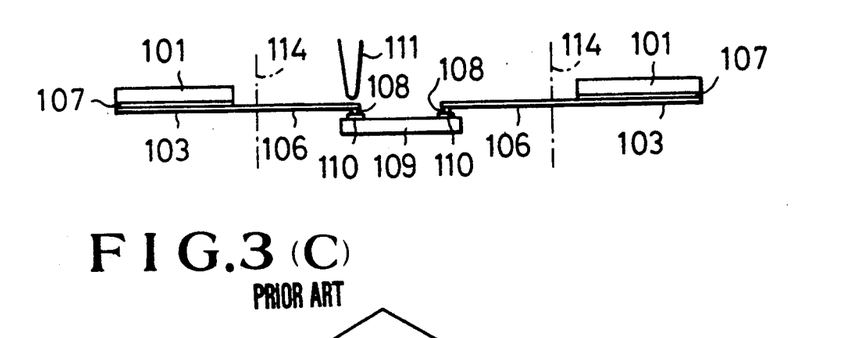
Figure 3D:
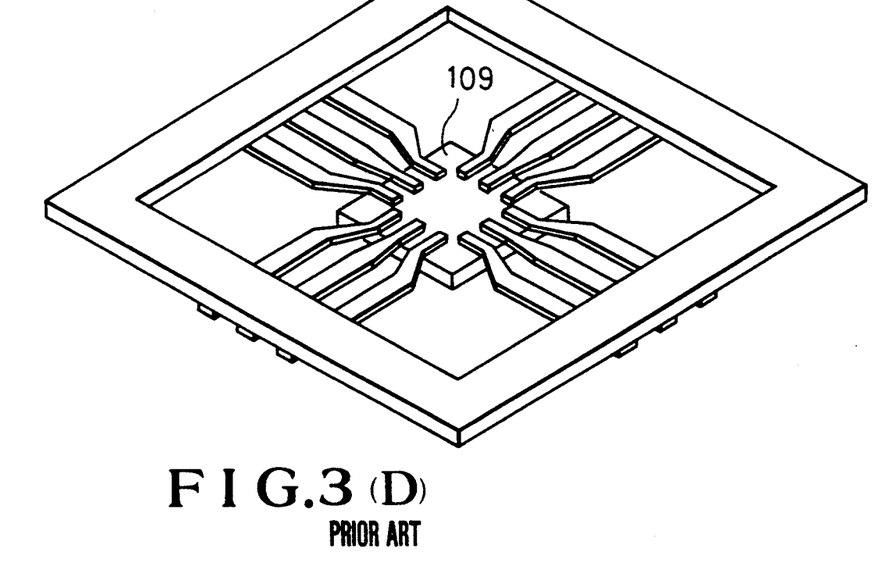
Figure 3E:
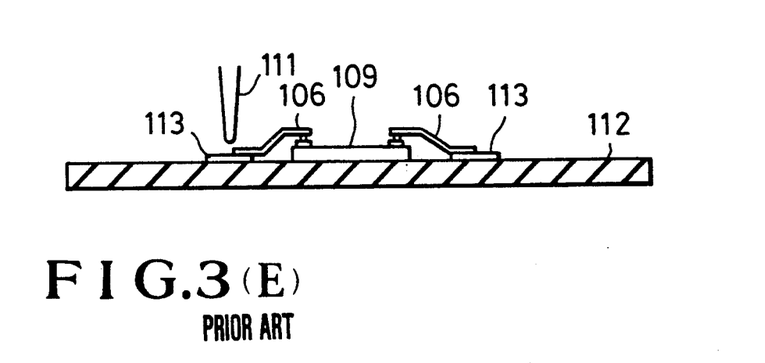

A second method utilizes a film-like conductor (film carrier). FIG. 2 shows a connection using a film carrier. In this method, the wires used in the method shown in FIG. 1 are replaced with a film carrier 207. As shown in FIG. 3A and 3B, a film carrier of this type is formed to have a structure comprising an insulating flexible substrate 101, an opening portion 102 formed in the insulating flexible substrate, RF electrodes 103, bias supply electrodes 104, ground electrodes 105 and the like formed on one surface (in FIGS. 3A and 3B, the lower surface) of the insulating flexible substrate, and leads 106 connected to the RF, bias supply and ground electrodes 103, 104 and 105 in the opening portion 102 formed in the insulating flexible substrate. The film carrier having this arrangement is formed as follows. That is, a conductor foil consisting of, e.g., copper is adhered on the flexible substrate 101, in which the opening portion 102 is already formed, by an adhesive 107 and formed into a predetermined shape by a general-purpose punching method. Alternatively, after a conductor foil consisting of, e.g., copper adhered on the insulating flexible substrate 101 is formed into a predetermined shape by a general-purpose punching method, the opening portion 102 is formed by using an etchant which etches only the insulating flexible substrate. In addition, a bump 108 may be formed at the distal end portion of the lead 106 by plating or the like. The bump 108 has an effect of easily and reliably forming an electrical connection between the lead 106 and the device. The bare-chip semiconductor element is connected to the film carrier as shown in FIG. 3C. That is, the electrode pad 110 formed on the surface of the bare-chip semiconductor element 109 and the distal end of the lead 106 of the film carrier are heated and connected with each other by thermocompression bonding by using a capillary 111. FIG. 3D is a perspective view in which the bare-chip semiconductor element 109 is connected to the film carrier. The film carrier connected to the semiconductor element 109 (FIG. 3D) is conveyed to a predetermined position of a mounting substrate 112 or the like. An electrode 113 formed on the mounting substrate 112 and the end of a lead 106 opposite to that connected to the bare-chip semiconductor element 109 are heated and connected with each other by thermocompression bonding by using the capillary 111. Thereafter, the resultant structure is cut at cut portions 114 shown in FIG. 3C, and unnecessary leads and insulating flexible substrate are disposed, thereby completing the device as shown in FIG. 3E. In order to house the semiconductor element in the package, the semiconductor element is connected to the internal connection terminals of the package by thermocompression bonding and unnecessary portions are disposed as described above.

In the above convention film carrier, however, since a plurality of leads are arranged to be simultaneously connected to a plurality of electrode pads formed on the surface of the bare-chip semiconductor element or the like and a plurality of internal connection terminals formed in the package, the length of each lead required for a connection must have a margin. Therefore, an inductance component corresponding to the lead length cannot be minimized. As a result, a connection between the bare-chip semiconductor element or the like and the package degrades frequency characteristics of an RF module constituted by one or a plurality of such bare-chip semiconductor elements.

SUMMARY OF THE INVENTION

It is an object of the present invention to provide an RF film carrier capable of connecting and mounting a bare-chip semiconductor element to internal connection terminals of a package with a low inductance and an impedance match therebetween.

It is another object of the present invention to provide an RF film carrier capable of mounting a plurality of elements in a package such that impedance-matched connections are realized between the elements in the package.

According to a first aspect of the present invention, there is provided a waveguide film carrier which has an insulating flexible substrate, RF, bias supply and ground electrodes formed on the insulating flexible substrate, and conductive leads connected to the electrodes, and which mounts a bare-chip semiconductor element in a package and RF-connecting electrode pads of the bare-chip semiconductor element to internal connection terminals of the package, wherein an opening portion corresponding to the bare-chip semiconductor element to be mounted is formed in a portion of the insulating flexible substrate, the leads are formed to project in the opening portion at positions corresponding to the electrode pads of the bare-chip semiconductor element to be mounted, the leads are formed on an outer peripheral portion of the insulating substrate to project at positions corresponding to the internal connection terminals of the package, and further comprising at least one waveguide constituted by the RF electrodes for contributing to RF signal propagation, the ground electrodes and the insulating flexible substrate.

According to a second aspect of the present invention, there is provided an RF IC film carrier comprising an insulating flexible substrate having an opening portion, a plurality of electrodes formed to be separated from each other on the flexible substrate, and a plurality of conductive leads for selectively connecting electrodes of a bare-chip semiconductor element to be located in the opening portion of the flexible substrate to the electrodes formed on the flexible substrate, wherein the other ends of the electrodes project outward from the flexible substrate, so that some of the electrodes and the flexible substrate constitute a waveguide.

According to a third aspect of the present invention, there is provided an RF IC comprising a bare-chip semiconductor element, a package having a base portion, a projecting portion, formed integrally with the base portion, for forming a closed loop, and a connection conductor formed across the projecting portion, a cover for the package, and an RF IC film carrier including an insulating flexible substrate having an opening portion, a plurality of electrodes formed to be separated from each other on the flexible substrate, and a plurality of conductive leads for selectively connecting electrodes of the semiconductor element located in the opening portion of the flexible substrate to the electrodes formed on the flexible substrate, the other ends of the electrodes projecting outward from the flexible substrate, so that some of the electrodes and the flexible substrate constitute a waveguide, wherein the film carrier is housed in a region surrounded by the projecting portion of the package, and the electrodes on the film carrier are connected to the connection conductor of the package.

According to the present invention, at least the RF electrode for transmitting an RF signal constitutes the waveguide together with the insulating flexible substrate and the ground electrode, and a characteristic impedance required for this arrangement can be realized. As a result, an impedance match can be easily obtained between the bare-chip semiconductor elements or between each bare-chip semiconductor and an internal connection terminal of a package.

DETAILED DESCRIPTION OF THE PREFERRED EMBODIMENTS

Embodiments of the present invention will be described in detail below with reference to the accompanying drawings.

EMBODIMENT 1

Coplanar Waveguide Structure

Figure 4:
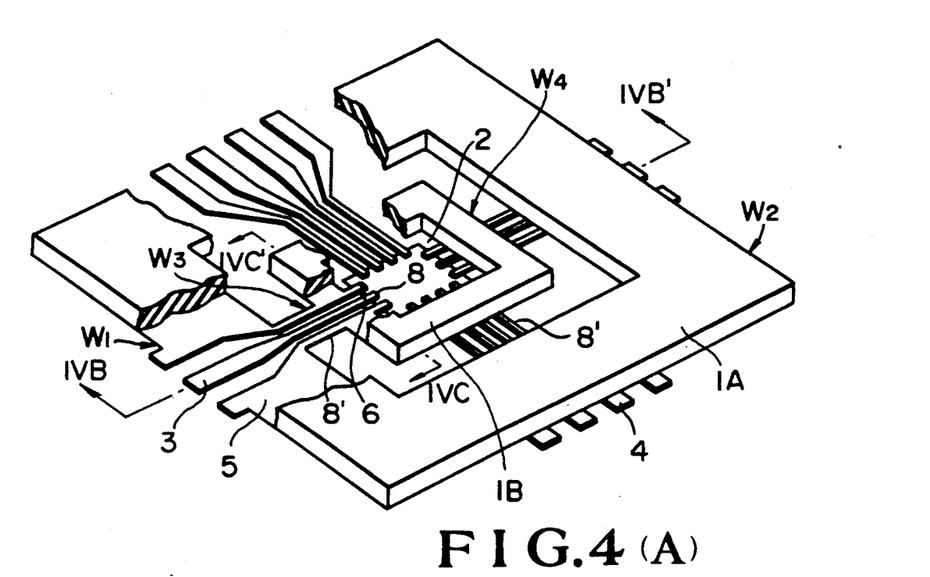
FIGS. 4A to 4G are views for explaining a first embodiment of the present invention.

FIGS. 4A to 4C are views for explaining a first embodiment of the present invention, in which FIG. 4A is a perspective view showning an overall arrangement, FIG. 4B is a sectional view taken along a line IVB—IVB' in FIG. 4A, and FIG. 4C is a sectional view taken along a line IVC—IVC' in FIG. 4A. Referring to FIGS. 4A to 4C, reference numerals 1A and 1B denote insulating flexible substrates. Referring to FIG. 4A, the substrates 1A and 1B are rectangular members having openings in their central portions. The substrates 1A and 1B, however, may constitute a so-called ribbon-like structure in which substrates having the same structure are arranged side by side. Reference numeral 2 denotes an opening portion; 3, RF electrodes; 4, bias supply electrodes; 5, ground electrodes; 6, conductive leads; 8, element-side bumps; 8', package-side bumps; 9, a bare-chip semiconductor element; 10, electrode pads; 11, a capillary; 12, a mounting substrate; 13, an electrode; 14, cut portions; and 15, a second opening portion formed in the insulating flexible substrate 1. Although an adhesive 7 is not used because it changes permittivity of the insulating flexible substrate 1, it can be similarly used as shown in FIG. 3B.

Figure 5A:
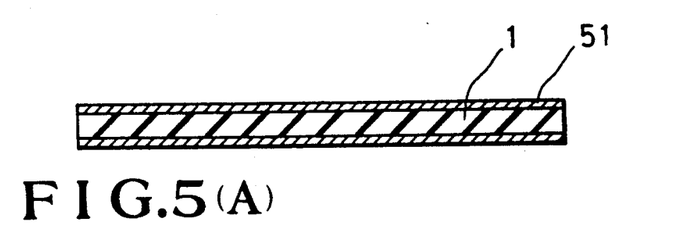
FIGS. 5A to 5G are views for explaining a method of forming a waveguide film carrier according to the present invention.

A manufacturing method of the present invention will be described first with reference to FIGS. 5A to 5G. In order to manufacture the waveguide film carrier according to the present invention, as shown in FIG. 5A, a metal such as copper is deposited as underlying conductor films 51 on the front and rear surfaces of the insulating flexible substrate 1 consisting of a polyimide resin by sputtering, vapor deposition or the like. The thickness of the polyimide film is about 50 μm. In order to improve bonding strength between the polyimide film and the metal, it is effective to perform reverse sputtering of a small amount of Ar ions on the surfaces of the polyimide film before vapor deposition.

Figure 5B:
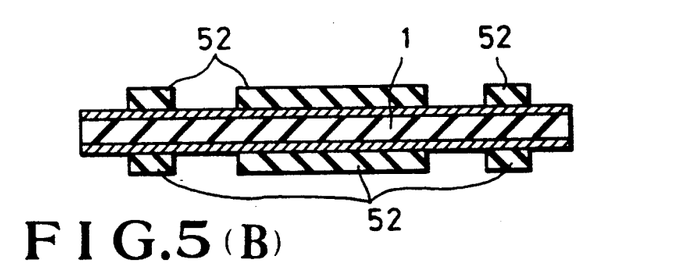

As shown in FIG. 5B, a photoresist 52 is coated on both the surfaces, and the surfaces are exposed and developed to form an opening in a portion in which a waveguide conductor film is formed. In general, however, it is difficult to uniformly coat a resist on a thin flexible film. In this case, therefore, a film-like resist, e.g., LISTON (tradename) available from Du Pont de Nemours, E. I., Co. may be laminated on the flexible film.

Figure 5C:
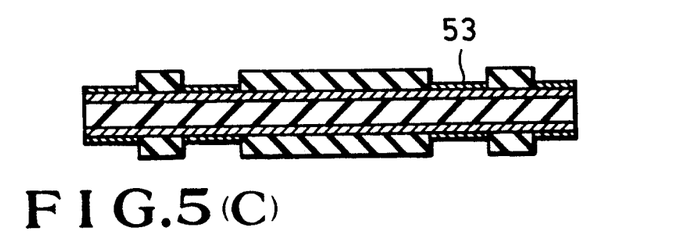
Figure 5D:
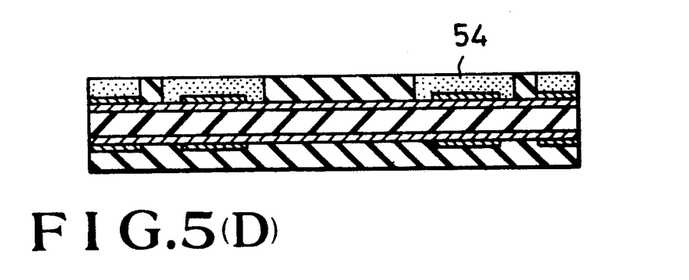
Figure 5E:
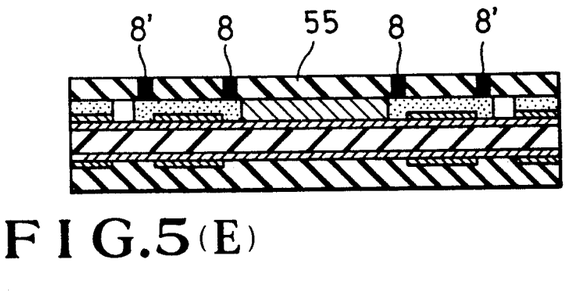
Figure 5F:
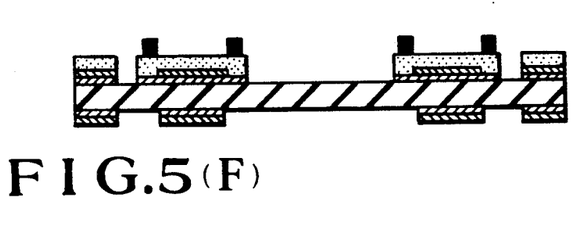
Figure 5G:
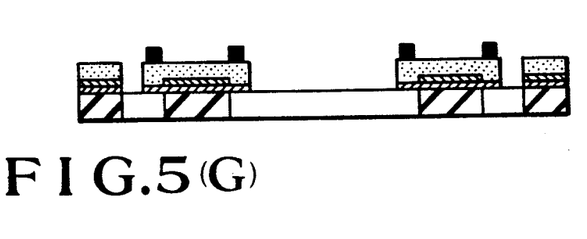

As shown in FIG. 5C, an etching mask conductor film 53, e.g., Ni is formed on the front side of the region opened by development. This film serves as a mask upon formation of an opening portion in the film. As shown in FIG. 5D, a waveguide conductor film 54 is formed on the surface by electrolytic plating. As shown in FIG. 5E, in order to form a gold bump at the distal end of each lead, a second resist film 55 is formed, a necessary opening is formed, and then gold is deposited by electrolytic plating. Thereafter, as shown in FIG. 5F, the resist is removed. As shown in FIG. 5G, the polyimide film is etched by using the waveguide conductor film 54 and the etching mask conductor film 53 as masks to form an opening portion having a proper size in a predetermined portion. At this time, effective examples of an etchant are KOH and a solution mixture of ethanol and water.

In this manner, as shown in FIGS. 4A to 4C, the film carrier having, on the insulating flexible substrate 1, conductors such as the RF electrodes 3, the bias supply electrodes 4 and the ground electrodes 5, the leads 6 connected to the conductors, and the bumps 8 and 8' formed at the distal ends and in the middle portions of the leads 6, is formed. FIG. 4C is a sectional view showing a part of the coplanar waveguide of the film carrier.

In this embodiment, the waveguides are formed at four positions $W_1$, $W_2$, $W_3$ and $W_4$. That is, the outside waveguides $W_1$ and $W_2$ are coplanar waveguides formed to have a predetermined characteristic impedance by the central RF electrode 3, the ground electrodes 5 at both the sides of the RF electrode 3, and the insulating flexible substrate 1. The inside waveguides $W_3$ and $W_4$ are coplanar waveguides formed to have a predetermined characteristic impedance by the central RF electrode 3, the ground electrodes 5 at both the sides of the RF electrode 3, and the insulating flexible substrate 1. The waveguides $W_1$ and $W_2$ are connected to the waveguides $W_3$ and $W_4$, respectively, by the short leads 6. The short leads 6 projecting in the opening portion 2 are connected to the inside waveguides $W_3$ and $W_4$.

As is apparent from comparison between the structure shown in FIG. 4A and the conventional structure shown in FIG. 3A, in FIG. 3A, no waveguide is formed and the long leads 6 are connected to the respective electrodes 3 to 5. On the contrary, in the structure according to the present invention shown in FIG. 4A, the leads 6 are very short because the waveguides $W_3$ and $W_4$ are formed. Note that in the above description, the bias supply electrode 4 differs from the RF electrode 3. However, a part of the bias supply electrode 4 is used as the ground electrode 5 so that the bias supply electrode 4 is sandwiched by the ground electrodes 5, thereby constituting the coplanar waveguide structure. Therefore, it is apparent that the concept of the coplanar waveguide structure can be applied to the bias supply electrode 4. This will be the same in embodiments to be described later.

Figure 4D:
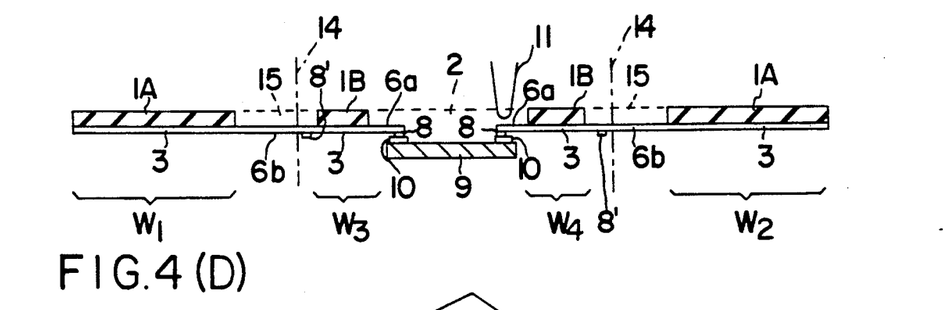
Figure 4E:
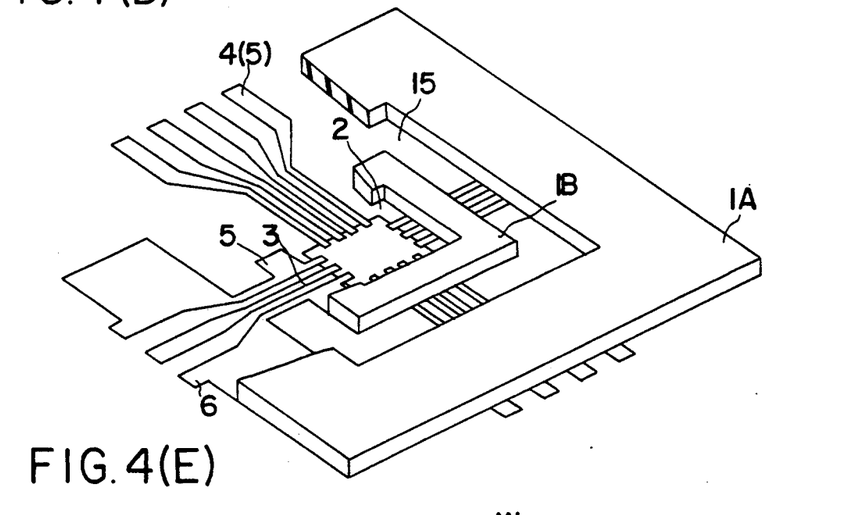

Mounting will be performed as described below. As shown in FIG. 4D, the waveguide film carrier is conveyed to a predetermined portion of the bare-chip semiconductor element 9 so that the element-side bumps 8 on the inner lead 6a, outer lead 6b 6 overlap the electrode pads 10 formed on the bare-chip semiconductor 9. The leads 6 and the electrode pads 10 on the surface of the bare-chip semiconductor element 9 are heated and connected with each other by thermocompression bonding by using the capillary 11, thereby connecting and mounting the waveguide film carrier to the bare-chip semiconductor element 9. FIG. 4E is a partially-cutaway perspective view showing a connected/mounted state. In this state, RF characteristics of the bare-chip semiconductor can be measured. Mounting to packages of devices found to be defective as a result of the measurement is cancelled to improve the manufacturing yield of products.

Figure 6:
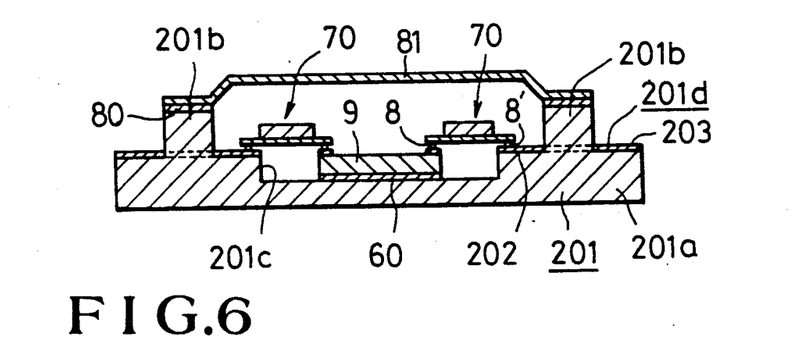
FIG. 6 is a sectional view showing an RF IC mounted in a package.

A method of connecting and mounting the waveguide film carrier, on which the bare-chip semiconductor element 9 is connected and mounted, to a package will be described below. As shown in FIG. 4B, the leads 6 are cut at positions represented by reference numerals 14. When the waveguide film carrier is inserted in a package after cutting, the package-side bumps 8' formed on the leads 6 overlap internal connection terminals. Therefore, the overlapped portions are heated by the capillary 11 and connected by thermocompression bonding. FIG. 6 is a sectional view showing an RF IC in which the bare-chip semiconductor and the film carrier are mounted in the package. Referring to FIG. 6, reference numeral 201 denotes a package; 202, the internal connection terminals; 203, package input/output terminals; 60, a solder; and 70, a film carrier. The package 201 comprises a base portion 201a, a closed-loop or annular projecting portion 201b, a recess portion 201c formed in a central portion of the base portion 201a surrounded by the projecting portion 201b, and a conductor 201d formed across the projecting portion 201b on the base portion 201a and constituting the internal connection terminals 202 and the external connection terminals 203. The film carrier 70 mounting the bare-chip semiconductor element 9 thereon is dropped in a space surrounded by the projecting portion 201. At this time, the bare-chip semiconductor element 9 is housed in the recess portion 201c and fixed to the bottom of the recess portion 201c of the base 201a by the solder 60. The electrodes (3, 4 and 5 in FIG. 4A) of the carrier 70 are positioned on the internal connection terminals 202 of the package 201 and connected thereto directly or via the bumps. Thereafter, a seal ring 80 is placed on the projecting portion 201b and a metal cover 81 is placed thereon. These members are seam-joining to complete an RF IC. The connection point of the bare-chip semiconductor element 9 with respect to the film carrier 70 is preferably at the same level as that with respect to the internal connection terminals 202. The solder of the semiconductor element and the package also serves to equalize the levels. The solder may be replaced with an adhesive.

Figure 4F:
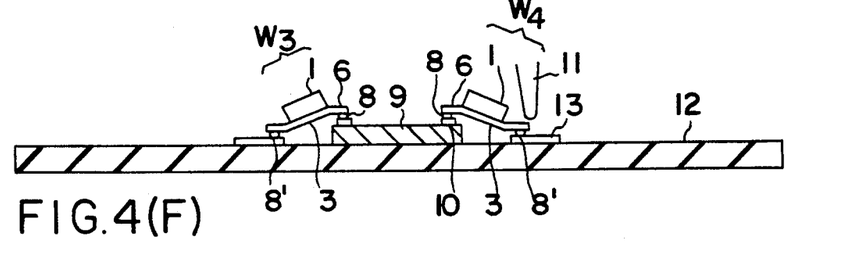

A method of connecting and mounting the semiconductor element to a mounting substrate 12 will be described below. According to a first method, as shown in FIG. 4F, the waveguide film carrier having the bare-chip semiconductor element 9 thereon is conveyed to a predetermined position on the mounting substrate 12, and the leads 6 and the electrode 13 on the surface of the mounting substrate 12 are heated by the capillary 11 and connected by thermocompression bonding, thereby connecting and mounting the waveguide film carrier on the mounting substrate 12. Thereafter, the rear surface of the bare-chip semiconductor element 9 is connected to the mounting substrate 12 by a solder or the like.

Figure 4G:
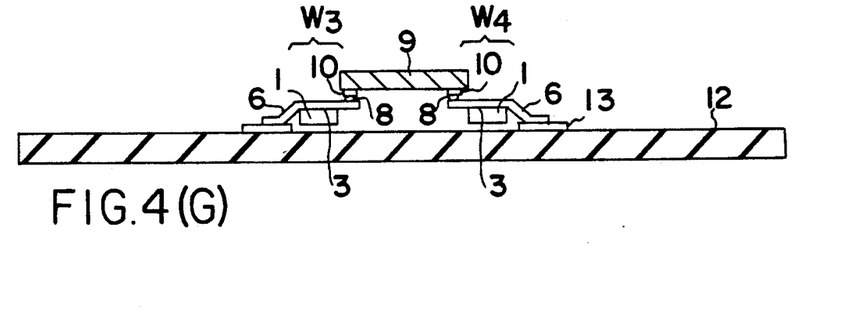

According to a second method of connecting and mounting the film carrier to the mounting substrate 12, as shown in FIG. 4G, the waveguide film carrier, on which the bare-chip semiconductor element 9 is connected and mounted, is reversed so that an electrode surface of the bare-chip semiconductor element 9 serves as the electrode 13 surface of the mounting substrate 12. The waveguide film carrier is conveyed to a predetermined position on the mounting substrate 12, and the leads 6 and the electrode 13 of the surface of the mounting substrate 12 are heated by the capillary 11 and connected by thermocompression bonding, thereby connecting and mounting the waveguide film carrier on the mounting substrate 12. Finally, in either of the two methods shown in FIGS. 4F and 4G, the substrate is cut at the cut portions 14 (FIG. 4D) formed in the second opening portion 15, and unnecessary leads 6 and an outer peripheral portion of the insulating flexible substrate 1A are disposed.

As described above, according to the present invention, the waveguide film carrier having the impedance-matched waveguides $W_3$ and $W_4$ is used for the connection between the bare-chip semiconductor element and the package or mounting substrate. Therefore, RF characteristics can be improved as compared with connections using wires, ribbons and the like.

Figure 7:
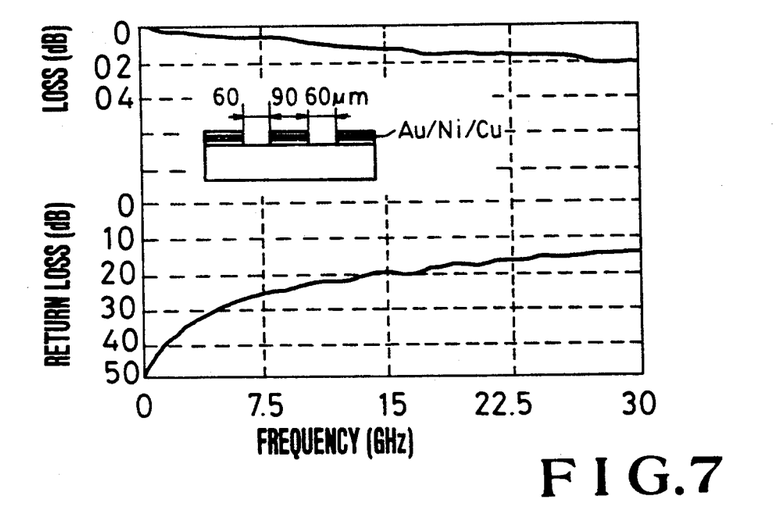
FIG. 7 is a graph showing transmission characteristics of a coplanar waveguide according to the first embodiment.

FIG. 7 is a graph showing transmission characteristics of the coplanar waveguide of the above embodiment. The waveguide does not cause unnecessary resonance within a range of DC to 30 GHz and therefore can be applied to a wide-band circuit.

Figure 8:
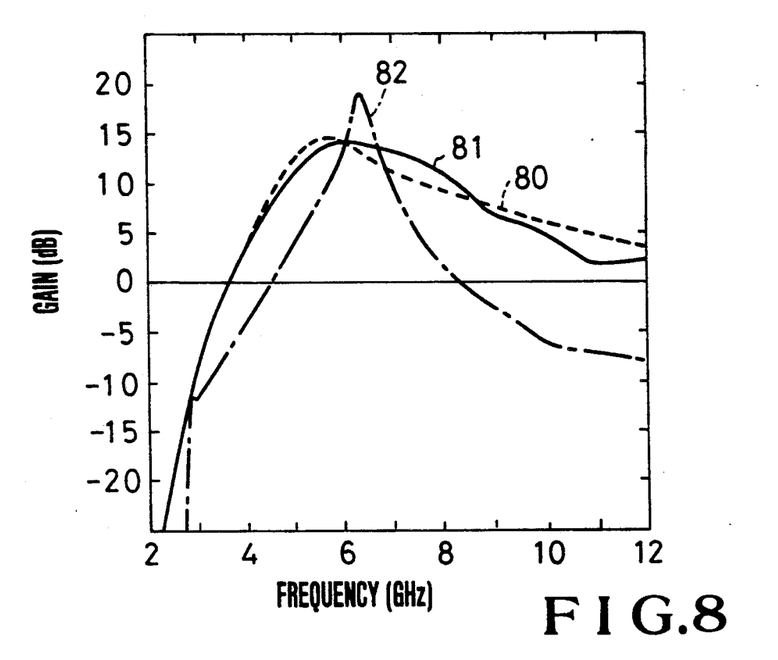
FIGS. 8 and 9 are graphs for comparing RF characteristics.
Figure 9:
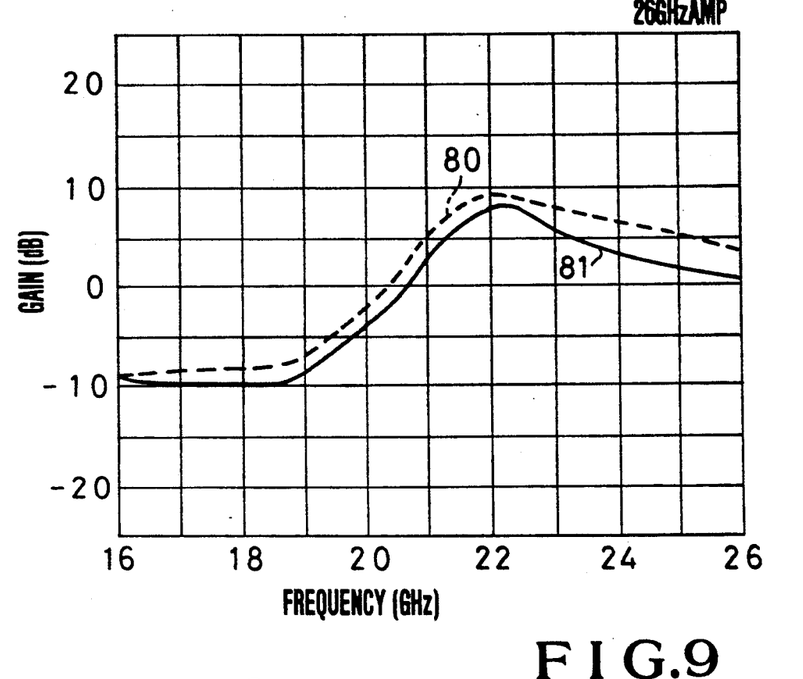

FIGS. 8 and 9 are the frequency characteristics of the MMIC (MMIC: monolythic microwave integrated circuit) amplifier chip comparing an RF characteristic curve 80 measured by connecting a meter directly to a bare-chip semiconductor with a characteristic curve 81 obtained by measuring a characteristic of the same element mounted in a package via the film carrier of the present invention from outside the package. For comparison, FIG. 8 also shows a measured value 82 obtained when the element is mounted by using wires. As is apparent from FIGS. 8 and 9, when the film carrier of the present invention is used, characteristics substantially corresponding to the original characteristics are obtained, a loss at the film carrier is small, and no unnecessary resonance and the like due to an inductance component at the lead portion occur.

EXAMPLE 2

Microstrip Line Structure

Figure 10A:
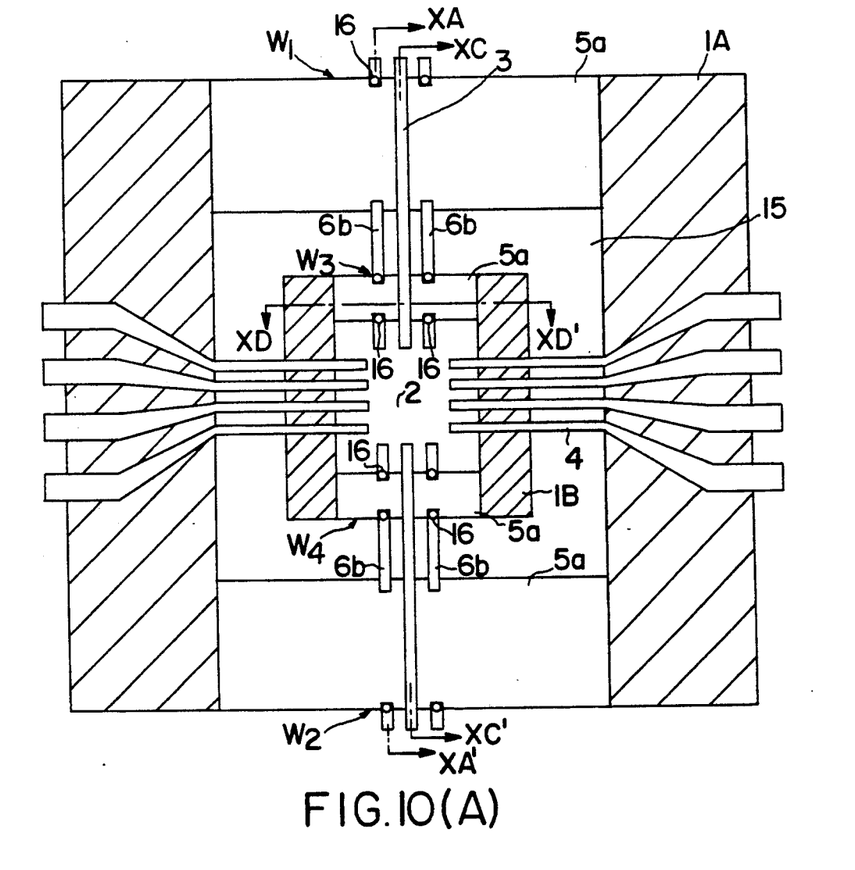
FIGS. 10A to 10E are views for explaining a second embodiment of the present invention.
Figure 10B:
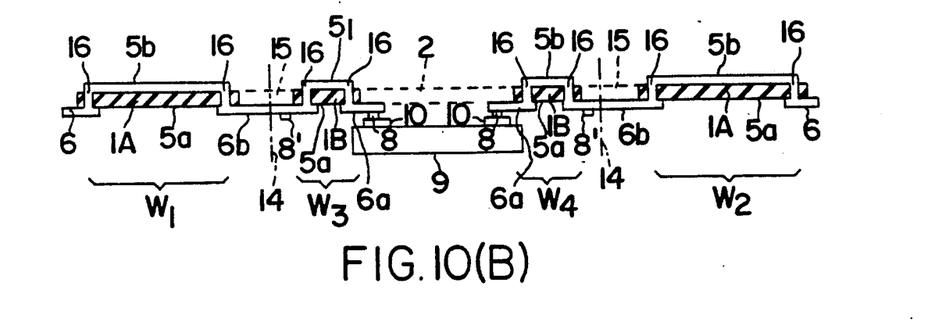
Figure 10C:
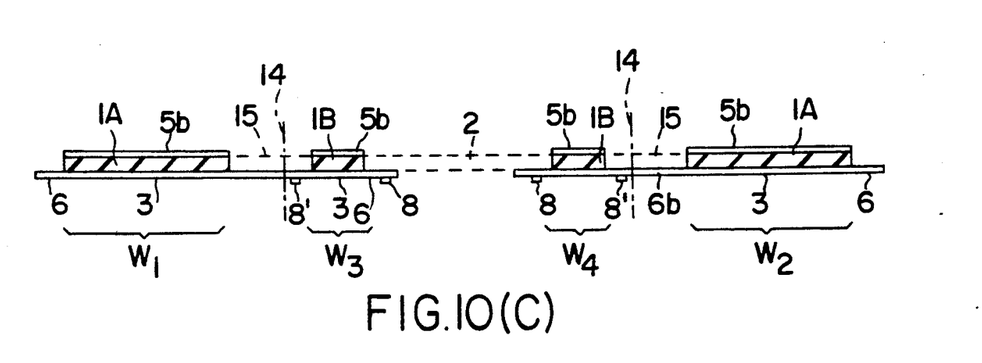
Figure 10D:
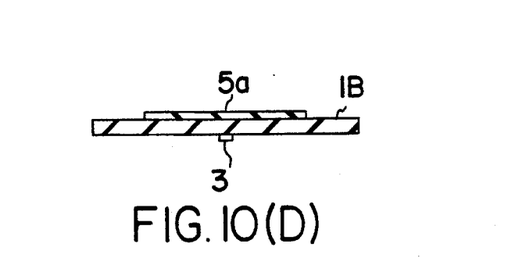
Figure 10E:
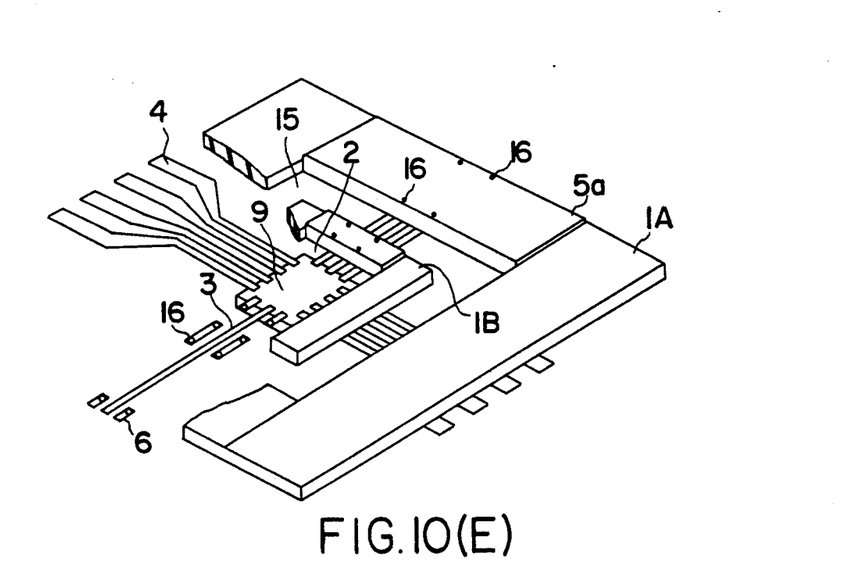

FIGS. 10A to 10D are views for explaining a second embodiment of the present invention, in which FIG. 10A is a plan view showing an arrangement of the second embodiment, FIG. 10B is a sectional view taken along a line XA—XA' in FIG. 10A, FIG. 10C is a sectional view taken along a line XC—XC' in FIG. 10A, and FIG. 10D is a sectional view taken along a line XD—XD' in FIG. 10A. Ground electrodes 5 are formed on the surface opposite to RF electrodes 3 and are connected to leads 6 via through holes 16. FIG. 10E shows a state in which a bare-chip semiconductor 9 is mounted. A film carrier of the second embodiment is similar to that of the first embodiment in that all of the leads for connections are formed on one surface of an insulating substrate. In addition, a method of connecting the bare-chip semiconductor element 9 to the waveguide film carrier and a method of connecting the waveguide film carrier to a package or a mounting substrate 12 are the same as those in the first embodiment.

EMBODIMENT 3

Coplanar Waveguide Structure

Figure 11A:
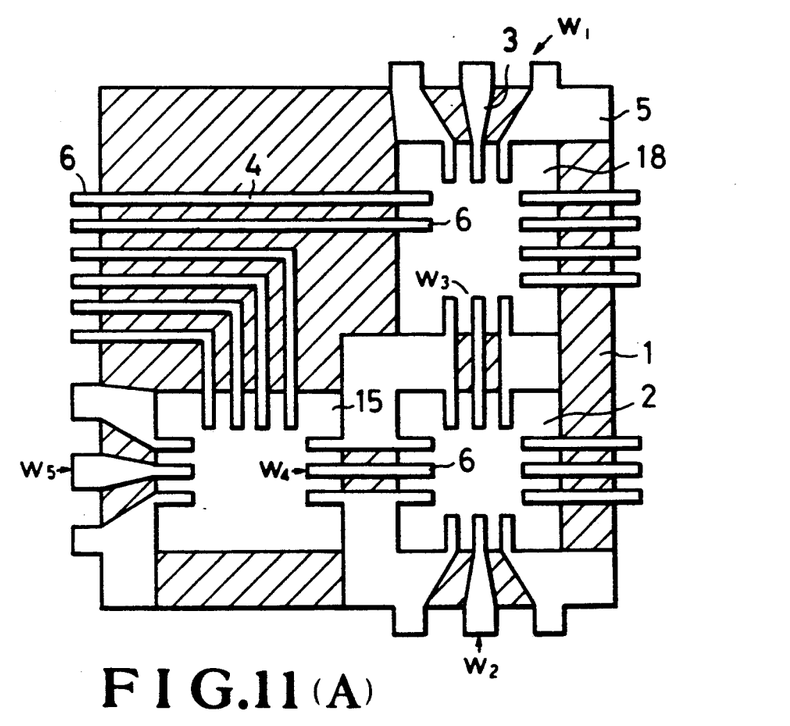
FIGS. 11A and 11B are views for explaining a third embodiment of the present invention.
Figure 11B:
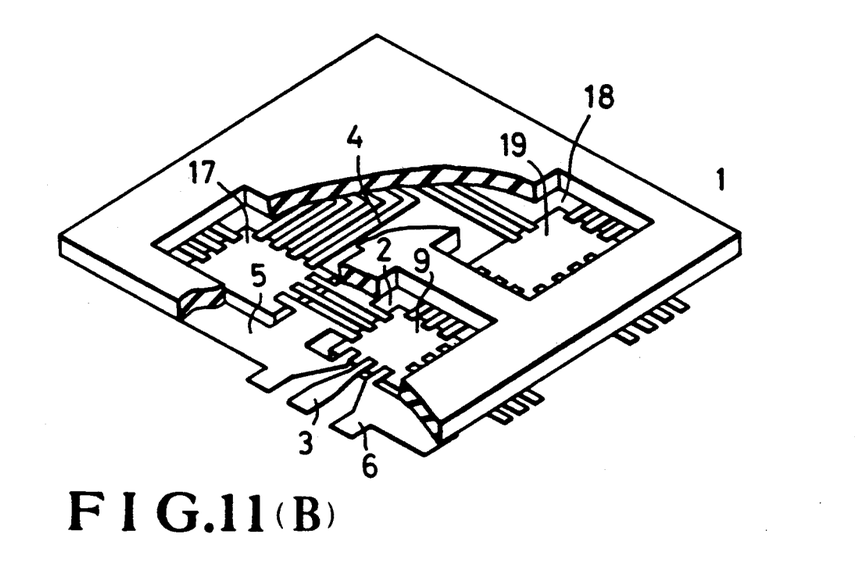

FIGS. 11A and 11B are views for explaining a third embodiment of the present invention. The third embodiment exemplifies a waveguide film carrier for connecting a plurality of bare-chip semiconductor elements. Referring to FIGS. 11A and 11B, reference numeral 17 denotes a second bare-chip semiconductor element; 18, a third opening portion; and 19, a third bare-chip semiconductor element. In the third embodiment, a method of connecting and mounting the waveguide carrier to a package is similar to that in the first embodiment.

As described above, a plurality of bare-chip semiconductor elements 9, 17 and 19 are connected by the waveguide film carrier having impedance-matched waveguides $W_1$ to $W_5$. Therefore, the RF characteristics can be improved as compared with those of connections using wires, ribbons and the like. In addition, since the pattern of the waveguide film carrier can be easily changed by changing an etching mask, packages can be easily unified.

EMBODIMENT 4

Microstrip Line

Figure 12A:
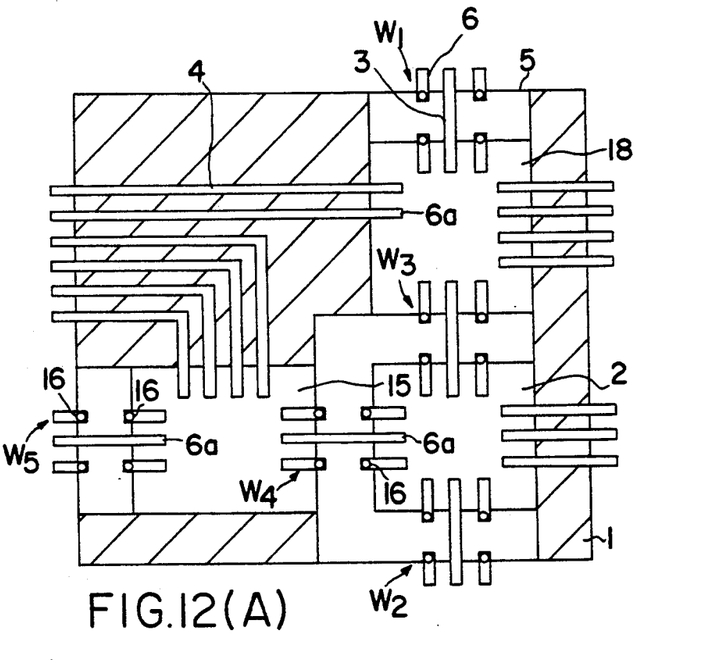
FIGS. 12A and 12B are views for explaining a fourth embodiment of the present invention.
Figure 12B:
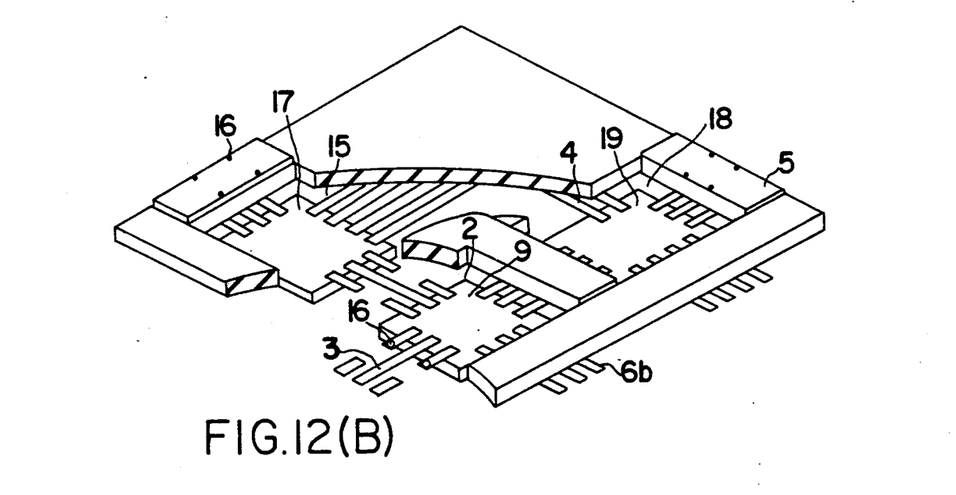

FIGS. 12A and 12B are views for explaining a fourth embodiment of the present invention. In FIGS. 12A and 12B, reference numerals 1 to 19 denote the same parts as in the embodiment shown in FIGS. 11A and 11B. In the third embodiment, a plurality of bare-chip semiconductor elements 9, 17 and 19 are connected by a waveguide film carrier having impedance-matched waveguides $W_1$ to $W_5$. Therefore, the RF characteristics can be improved as compared with those obtained by connections using wires, ribbons and the like. In addition, since the pattern of the waveguide film carrier can be easily changed, packages can be easily unified.

EMBODIMENT 5

Shielded Coplanar Waveguide

Figure 13:
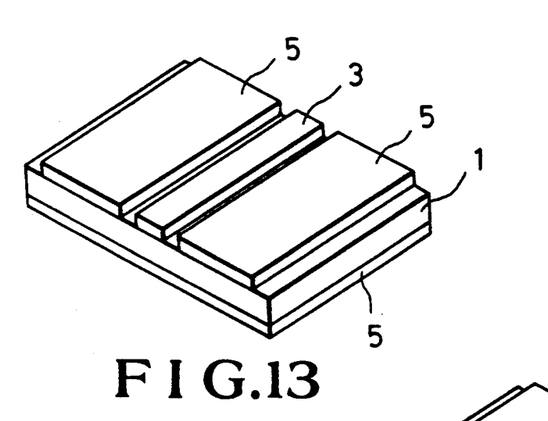
FIG. 13 is a perspective view of a main part for explaining a fifth embodiment of the present invention.

FIG. 13 is a perspective view of a main part for explaining a fifth embodiment of the present invention. FIG. 13 shows a shielded coplanar waveguide as the waveguides $W_1$ to $W_5$ in each of the above embodiments. In the fifth embodiment, an RF electrode 3 is formed on the front surface of an insulating flexible substrate 1 and ground electrodes 5 are formed at both sides of the RF electrode 3, thereby constituting a coplanar waveguide. In addition, a ground electrode 5 having a shielding effect is formed on the rear surface of the insulating flexible substrate 1. The ground electrodes 5 on the front and rear surfaces are connected via through holes.

EMBODIMENT 6

Slot Line Structure

Figure 14:
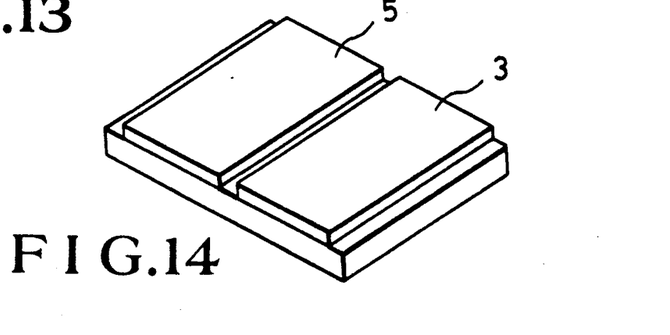
FIG. 14 is a perspective view of a main part for explaining a sixth embodiment of the present invention.

FIG. 14 is a perspective view of a main part for explaining a sixth embodiment of the present invention. In the sixth embodiment, a pair of an RF electrode 3 and a ground electrode 5 are formed on one surface of an insulating flexible substrate 1.

As has been described above, according to the present invention, one or more opening portions are formed in a portion of an insulating flexible substrate, leads are formed in these opening portions, and RF, bias supply and ground electrodes are formed on or in the insulating flexible substrate, so that the RF and ground electrodes and the insulating flexible substrate constitute a waveguide having a predetermined characteristic impedance. Therefore, a lead length can be shortened, an inductance component of a lead can be reduced, and impedance match can be easily obtained. As a result, not only a bare-chip semiconductor element can be mounted while impedances are matched, but also a plurality of bare-chip semiconductor elements can be closely connected by using the insulating flexible substrate. Therefore, simultaneous mounting of microwave devices on a multichip aiming at improvements in RF characteristics can be realized. In addition, since leads are formed integrally with the insulating flexible substrate on one surface of the substrate, they need not be deformed to be connected to a chip or a package. As a result, mechanical strength is improved and reliability is assured for a long period of time. Furthermore, since the pattern of the waveguide film carrier can be easily changed by using a photolithography technique, multichip mounting packages can be advantageously standardized.

Moreover, a coplanar waveguide, a microstrip line, a shielded coplanar waveguide and a slot line can be selectively used as the waveguide in accordance with the number or the like of bare-chip semiconductor elements to be mounted.

What is claimed is:

1. A waveguide film carrier for providing interconnections between electrode pads of a bare-chip semiconductor element and internal elements of a package, said waveguide film carrier comprising:

an insulating flexible film, on which a plurality of conductive areas is formed, said conductive areas comprising RF and DC bias electrodes and a portion of a ground electrode formed on one surface of said insulating flexible film, the remaining portion of said ground electrode formed on the other surface thereof, said portion of the ground electrode formed on one surface of the insulating flexible film being connected to the remaining portion formed on the other surface via a through hole, said RF and DC bias electrodes extending into openings of said insulating flexible film to make inner and outer leads, which include bumps formed at distal end portions of said inner and outer leads.

2. A waveguide film carrier according to claim 1, wherein said insulating flexible film has bonding windows, and said bumps formed on said distal end portions of said inner leads being connected to corresponding electrode pads of said bare-chip semiconductor element which are positioned in relation with said bonding windows.

* * * * *